United States Patent

Nagai

[11] Patent Number: 5,960,020
[45] Date of Patent: Sep. 28, 1999

[54] SEMICONDUCTOR LASER DIODE INCLUDING RIDGE AND PARTIALLY DISORDERED ACTIVE LAYER

[75] Inventor: Yutaka Nagai, Tokyo, Japan

[73] Assignee: Mitsubishi Denki Kabushiki Kaisha, Tokyo, Japan

[21] Appl. No.: 08/882,208

[22] Filed: Jun. 25, 1997

[30] Foreign Application Priority Data

Feb. 20, 1997  [JP]  Japan .................................... 9-036511

[51] Int. Cl.$^6$ ........................................................ H01S 3/19
[52] U.S. Cl. .............................. 372/46; 372/45; 372/48; 372/96; 257/623; 437/129
[58] Field of Search .................................. 372/46, 45, 48, 372/96; 257/623; 437/129

[56] References Cited

U.S. PATENT DOCUMENTS

| | | | |
|---|---|---|---|
| 5,138,626 | 8/1992 | Yap | 372/46 |
| 5,412,680 | 5/1995 | Swirhun et al. | 372/45 |
| 5,581,570 | 12/1996 | Yoshida et al. | 372/46 |
| 5,757,835 | 5/1998 | Ono et al. | 372/46 |

FOREIGN PATENT DOCUMENTS

| | | |
|---|---|---|
| 277184 | 2/1990 | Japan . |
| 433380 | 4/1992 | Japan . |

*Primary Examiner*—Rodney Bovernick
*Assistant Examiner*—Sung T. Kim
*Attorney, Agent, or Firm*—Leydig, Voit & Mayer, Ltd.

[57] ABSTRACT

A ridge type laser diode with a stabilized horizontal transverse mode and little variation in peak output power and a method for producing the laser. The ridge type laser diode includes a semiconductor substrate; an active layer on the semiconductor substrate, the active layer being interposed between a lower cladding layer and an upper cladding layer; and a ridge waveguide having a width, the ridge waveguide being part of the upper cladding layer so that the active layer located directly opposite the ridge waveguide is a first high refractive index region having a first refractive index; and a second high refractive index region in the central part of the first high refractive index region, having a second, higher refractive index than the first refractive index, and formed by disordering a region other than the central part and having a width less than the width of the ridge waveguide.

14 Claims, 9 Drawing Sheets

SEMICONDUCTOR LASER DIODE INCLUDING RIDGE AND PARTIALLY DISORDERED ACTIVE LAYER

BACKGROUND OF THE INVENTION

1. Field of the Invention

The present invention relates to a laser diode which is used in optical information processing, optical communication and the like. More particularly, it relates to a ridge type laser diode and a method for producing the same.

2. Prior Art

Figure 14A:
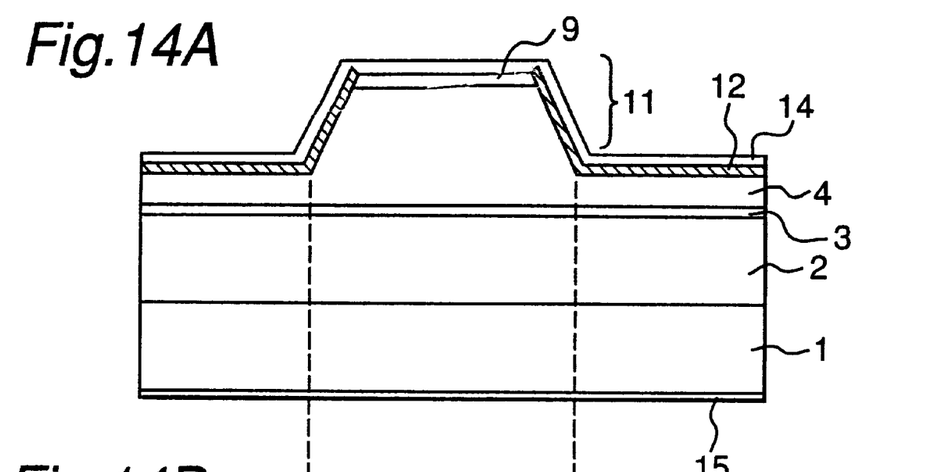
FIGS. 14A–14C are views showing a construction and a refractive index distribution, of a conventional ridge type laser diode.

At present, in a laser diode, a ridge type laser diode enclosing light in a transverse direction (width direction) of an active layer is used for various purposes. FIG. 14A is a schematic view showing a construction of a conventional ridge type laser diode. The ridge type laser diode shown in FIG. 14A is made by forming an n-type lower cladding layer 2 of n-type $Al_{0.5}Ga_{0.5}As$ an active layer 3 of a quantum well structure, a p-type first upper cladding layer 4 of p-type $Al_{0.5}Ga_{0.5}As$, a ridge waveguide 11, a p-type contact layer 9 of p-type GaAs, a p side electrode 14 and an insulating film 12 on the upper surface of an n-type semiconductor substrate 1 of n-type GaAs, wherein an n side electrode 15 is formed on the lower surface.

Figure 13A:
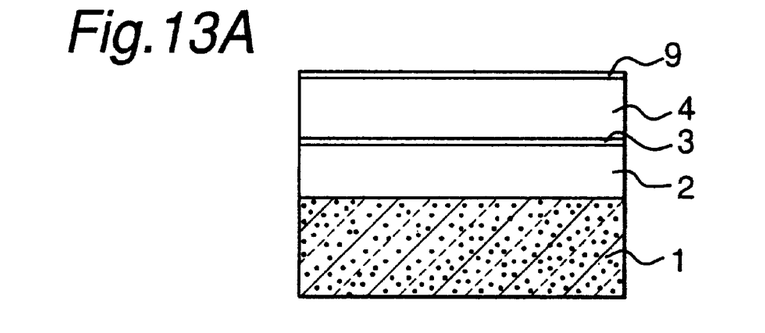
FIGS. 13A–13D are views for explaining steps for production of a conventional ridge type laser diode.
Figure 13B:
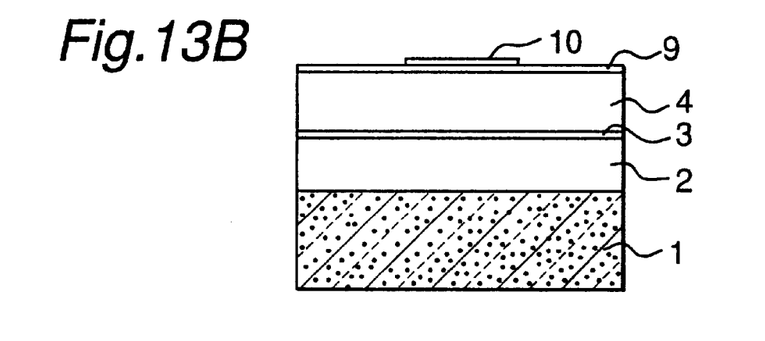
Figure 13C:
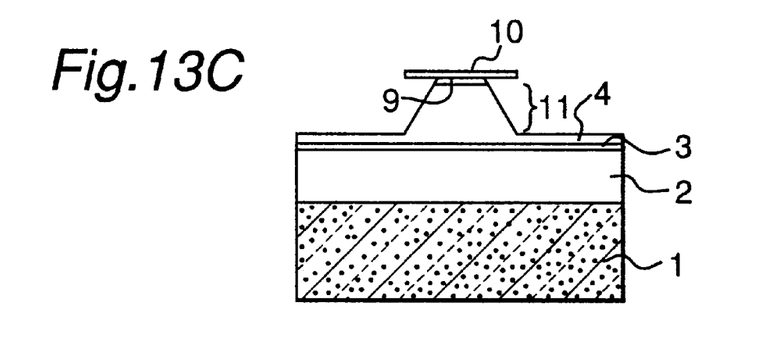

This conventional ridge type laser diode is produced by the following method for production. That is, as shown in FIG. 13A, the n-type lower cladding layer 2, the active layer 3 having a quantum well structure, the p-type first upper cladding layer 4 and the p-type contact layer 9 are respectively formed on the upper surface of the n-type semiconductor substrate 1 by epitaxial growth. After an insulating film is formed on the surface (whole surface of a wafer) of the p-type contact layer 9, the insulating film is patterned into a stripe-like configuration to form a stripe-like insulating film 10 as shown in FIG. 13B. As a material of this insulating film 10, $Si_2N_4$, $SiO_2$, etc. is used. Then, the p-type contact layer 9 and the p-type upper cladding layer 4 are etched to the midst of the p-type upper cladding layer 4 by using the insulating film 1 formed in the stripe-like configuration as a mask (ridge etching). As a consequence, the ridge waveguide 11 is formed as shown in FIG. 13C. When the p-type upper cladding layer 4 is formed of p-type $Al_{0.5}Ga_{0.5}As$ and the p-type contact layer 9 is formed of p-type GaAs, examples of an etchant for the ridge etching include a mixture of tartaric acid and hydrogen peroxide or of sulfuric acid, hydrogen peroxide and water.

Figure 13D:
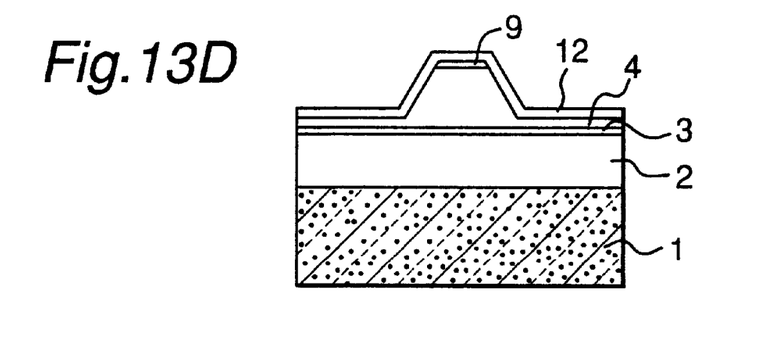

After the ridge etching is conducted and the stripe-like insulating film 10 is removed by wet or dry etching, an insulating film 12 is formed again on the whole surface of a wafer, as shown in FIG. 13D. Then, by using a photolithography technique, the insulating film 12 is removed only at a planar portion on the upper part of the ridge 11 to provide an opening part in the insulating film 12 by means of dry etching. When the p side electrode 14 is formed from above the opening part, the p side electrode 14 comes into contact with a crystalline layer only at the opening part on the upper surface of the ridge 11 with the result that current flows only through this part. Lastly, an n side electrode 15 is formed on the lower surface of the n-type semiconductor substrate 1 and a laser is separated from the wafer by means of cleavage to form a reflecting surface, thereby completing the device shown in FIG. 14A.

Next, an operation of a conventional ridge type laser diode shown in FIG. 14A will be explained.

In the ridge type laser diode, when a voltage is applied so that the p side electrode 14 becomes positive and the n side electrode 15 becomes negative, holes are injected into the active layer 3 having the quantum well structure through the p-type contact layer 9 and the p-type upper cladding layer 4, while electrons are injected into the active layer 3 through the n-type semiconductor substrate 1 and the n-type lower cladding layer 2. The holes and electrons recombine in an active region of the active layer 3 to emit light. At this time, when the light which exceeds the loss of the waveguide to a sufficiently high level, laser oscillation is generated. In case of the laser oscillation, a region other than the ridge waveguide 11 is covered with the insulating film 12 so that a current does not flow in regions other than the ridge waveguide. That is, the current flows only through the ridge waveguide 11 so that the laser oscillation is generated in the active layer 3 at the lower part of the ridge waveguide 11.

Figure 14B:
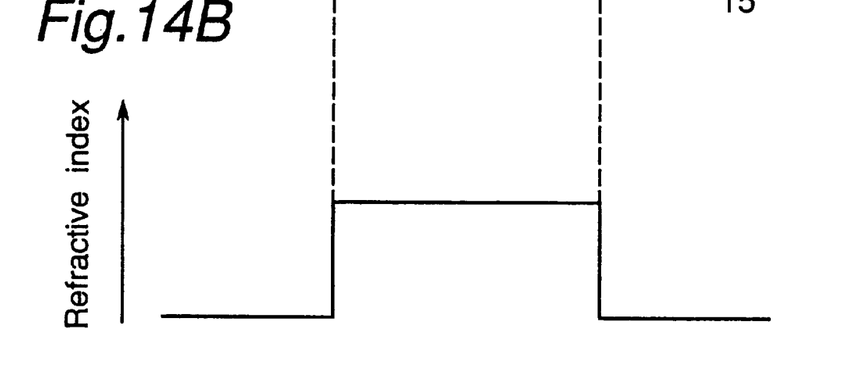

Generally, in the laser diode, the laser beams are enclosed in the active region with a difference in refractive index between the active layer and the cladding layer in a vertical direction with respect to the substrate. In the laser diode, the light in the vertical direction is effectively enclosed over the whole waveguide. On the other hand, in a horizontal direction with respect to the substrate, in the case of the ridge type laser diode, the light is enclosed in a high refractive index region having a high refractive index immediately below the ridge waveguide 11 outside of the active layer 3 and the light is guided by a difference in effective refractive index between the region immediately below the ridge waveguide 11 in the active layer and other regions. A refractive index distribution in a horizontal direction in the active layer 3 is shown in FIG. 14B. In order to obtain a stable laser oscillation in the ridge type laser diode, it is necessary to stabilize a horizontal transverse mode. In order to stabilize this horizontal transverse mode, it is necessary to set the width of the ridge waveguide 11 to be narrow so that a higher mode is not generated at the time of guiding the light in the high refractive index region. The width of the ridge waveguide 11 is preferably set to not more than 3 $\mu$m.

However, the thickness of the cladding layer is generally required to be set to not less than 1.5 $\mu$m in order to effectively enclose the laser beams generated in the active layer within the active layer. When an attempt is made to form the ridge waveguide 11 having a width of not more than 3 $\mu$m and a thickness of not less than 1.5 $\mu$m, the surface of the upper part of the ridge waveguide 11 becomes not more than 1 $\mu$m, and almost no planar part is present.. Consequently, it becomes extremely difficult to transfer at the time of removing the insulating film 12 on the upper surface of the ridge waveguide 11. Actually, it is impossible to form the ridge waveguide having a width of not more than 3 $\mu$m. Accordingly, it was impossible to prevent a higher mode from being generated and to stabilize the horizontal transverse mode by reducing the width of the ridge waveguide.

Figure 14C:
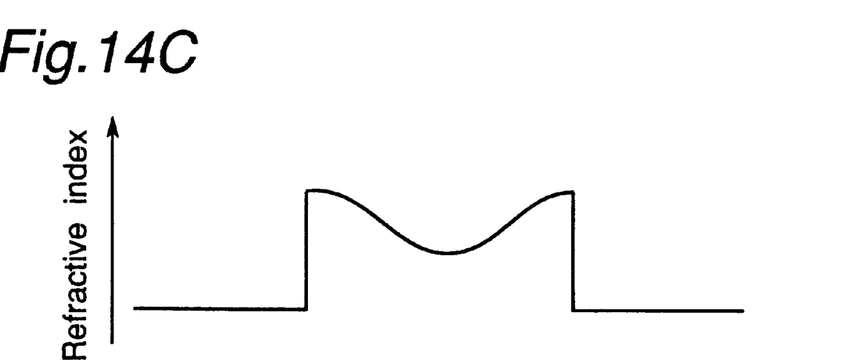

Referring to the refractive index distribution shown in FIG. 14B and the generation of the higher mode in the case where the light is guided in the high refractive index region of the active layer 3, the higher propagation mode is easily generated with the increase of a difference in refractive index between the high refractive index region and other parts. Accordingly, when the difference in refractive index is reduced, the width of the ridge waveguide 11 can be made wider. However, in this case, when current injection is increased, the refractive index of the central part of the high refractive index region having a high current density decreases as shown in FIG. 14C, thereby causing a phenomenon wherein the laser beams vary with a slight fluctuation of the current distribution. As a consequence, there arose a problem of generating a kink as a non-linear part where the light output does not increase in proportion to current in the practical range of the light output-current characteristics, thereby causing grave trouble in a practical use thereof. Accordingly, it has hitherto been difficult to obtain a ridge type laser diode which can stabilize the horizontal transverse mode and cause little peak output variation.

SUMMARY OF THE INVENTION

An object of the present invention is to solve the aforementioned problems, thereby providing a ridge type laser diode which can stabilize the horizontal transverse mode and cause little variation in peak output, and a method for producing the same.

The present inventors have found that the refrative index on both sides of the high refractive index region can be reduced by disordering both side parts, thereby making it possible to substantially reduce the width of the aforementioned high refractive index region. Thus, the present invention has been accomplished.

That is present invention provides a ridge type laser diode comprising:

a semiconductor substrate;

an active layer formed on the semiconductor substrate;

said active layer being interposed between a lower cladding layer and said an upper cladding layer; and a ridge waveguide having a predetermined width, said ridge waveguide being formed on said upper cladding layer so that the active layer located immediately below said ridge waveguide serves as a first high refractive index region having an effectively high refractive index;

wherein a second high refractive index region is formed in the central part of said first high refractive index region by disordering a region other than the central part to reduce the refractive index of the disordered region in said first high refractive index region.

DETAILED DESCRIPTION OF THE INVENTION

A first ridge type laser diode of the present invention comprising:

an active layer interposed between a lower cladding layer and an upper cladding layer; and a ridge waveguide having a predetermined width formed on said upper cladding layer so that the active layer located immediately below said ridge waveguide serves as a first high refractive index region having an effectively high refractive index;

wherein a second high refractive index region is formed in the central part of the first high refractive index region by disordering a region other than the central part to reduce the refractive index of the disordered region in the first high refractive index region.

As described above, since the first ridge type laser diode of the present invention is provided with the second high refractive index region having a width smaller than that of the aforementioned ridge waveguide, it is possible to provide a ridge type laser diode which can prevent the high dimension mode from generating and can stabilize the horizontal transverse mode, and which cause little variation in peak.

Furthermore, in the ridge type laser diode of the present invention, the width of the aforementioned ridge waveguide is preferably within the range from 3.5 $\mu$m, to 6 $\mu$m at which the ridge waveguide is easily produced, and the width of the aforementioned second high refractive index region is preferably not more than 3 $\mu$m at which the high dimension mode can be effectively inhibited from generating.

With this arrangement, it is possible to provide a ridge type laser diode which can stabilize the horizontal transverse mode and cause little variation in peak.

Furthermore, in the ridge type laser diode of the present invention, an etching stop layer is formed on the aforementioned upper cladding layer, the etching stop layer being made of a material having an etching rate smaller than that of the ridge waveguide material with respect to an etching solution used at the time of etching the ridge waveguide material constituting the aforementioned ridge waveguide, and the range waveguide is formed on the aforementioned etching stop layer. Therefore, the ridge waveguide can be easily constituted and have little scatter in performance.

Furthermore, in the ridge laser diode of the present invention, a protective film is preferably formed on the surface of the aforementioned upper cladding layer.

With this arrangement, it is possible to provide a ridge type laser diode capable of conducting stable oscillation.

Furthermore, the aforementioned protective film is made of $Si_3N_4$, more preferably.

With this arrangement, it is possible to provide a ridge type laser diode capable of conducting more stable excitation.

Furthermore, a film thickness of the aforementioned protective film is set to not less than 20 nm and not more than 50 nm, more preferably.

With this arrangement, it is possible to provide a ridge type laser diode having little scatter in performance.

In the ridge type laser diode wherein the aforementioned upper cladding layer is formed of a laminate of a first upper cladding layer and a second upper cladding layer, which are respectively made of a AlGaAs semiconductor material, and a stripe-like thick-walled part is provided on the aforementioned second upper cladding layer to allow the thick-walled part to serve as the aforementioned ridge type waveguide, a protective film of GaAs is preferably formed between the first upper cladding layer and the second upper cladding layer.

With this arrangement, it is possible to improve the performance of the ridge type laser diode.

The protective film comprises a first protective film formed continuously after forming the aforementioned first cladding layer and a second protective film formed on the first protective film, and the aforementioned second cladding layer is a AlGaAs semiconductor material film formed continuously after forming the second protective film.

With this arrangement, it is possible to improve the performance of the ridge type laser diode.

In the present invention, the aforementioned disordered region is preferably formed on each part having a predetermined length in an axial direction from two reflecting surfaces of the resonators of the ridge type laser diode.

With this arrangement, it is possible to provide a ridge type laser diode having an excellent performance.

The first method for producing ridge type laser diode of the present invention includes the disordered region formation step of ion-implanting from above the cladding layer through the insulating film having a width smaller than that of the aforementioned ridge waveguide to implant ions in the vicinity of the active layer including both sides of the aforementioned first high refractive index region, followed by heat treating at a predetermined temperature to disorder in the vicinity of the ion-implanted portion, thereby forming the aforementioned second high refractive index region. As a consequence, since the second high refractive index region having a width smaller than that of the aforementioned ridge waveguide, it is possible to provide a ridge type laser diode which can prevent the high dimension mode from generating and can stabilize the horizontal transverse mode and, which cause little variation in peak.

The second method for producing ridge type laser diode of the present invention includes after the step of forming the ridge waveguide on the aforementioned cladding layer the disordered region formation step of diagonally implanting ions using the ridge waveguide as a mask to implant ions in the vicinity of the active layer including both sides of the aforementioned first high refractive index region, followed by heat treating at a predetermined temperature to disorder in the vicinity of the ion-implanted portion, thereby forming the aforementioned second high refractive index region. As a consequence, since the second high refractive index region having a width smaller than that of the aforementioned ridge waveguide, it is possible to provide a ridge type laser diode which can prevent the high dimension mode from generating and can stabilize the horizontal transverse mode, and which cause little variation in peak.

PREFERRED EMBODIMENTS OF THE INVENTION

Embodiments of the present invention will be explained with reference to the accompanying drawings.

Embodiment 1

Figure 1:
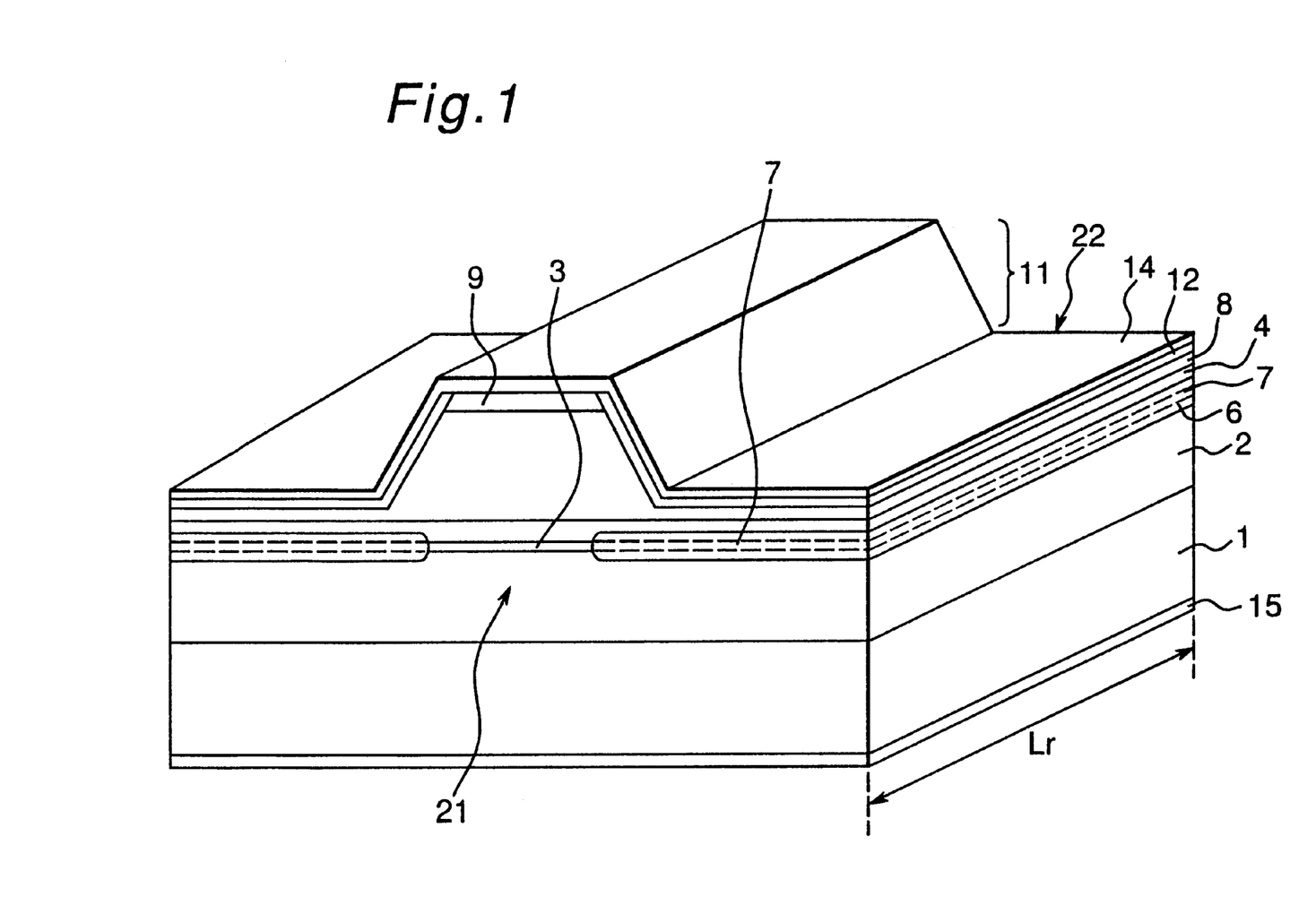
FIG. 1 is a perspective view schematically showing a ridge type laser diode according to Embodiment 1 of the present invention.

FIG. 1 is a perspective view showing a ridge type laser diode according to Embodiment 1 of the present invention. The ridge type laser diode of FIG. 1 is made by forming an n-type lower cladding layer 2 of n-type $Al_{0.5}Ga_{0.5}As$, an active layer 3 having a quantum well structure, a p-type first upper cladding layer 4 of p-type $Al_{0.5}Ga_{0.5}As$, a p-type second upper cladding layer 8 of p-type $Al_{0.5}Ga_{0.5}As$, a ridge waveguide 11 including a thick part of the p-type second upper cladding layer 8, a p-type contact layer 9 of p-type GaAs, a p side electrode 1, an insulating film 12 and a p side electrode 14 on an n-type semiconductor substrate 1 of n-type GaAs, followed by forming a, Si ion implantation region 6, wherein Si ions are implanted into the region including the active layer 3, and a disordered region 7. The "disordering" refers to a phenomenon wherein atoms of well layers having different Al composition ratios constituting a quantum well structure and a barrier layer are mixed to form a uniform composition.

Figure 4:
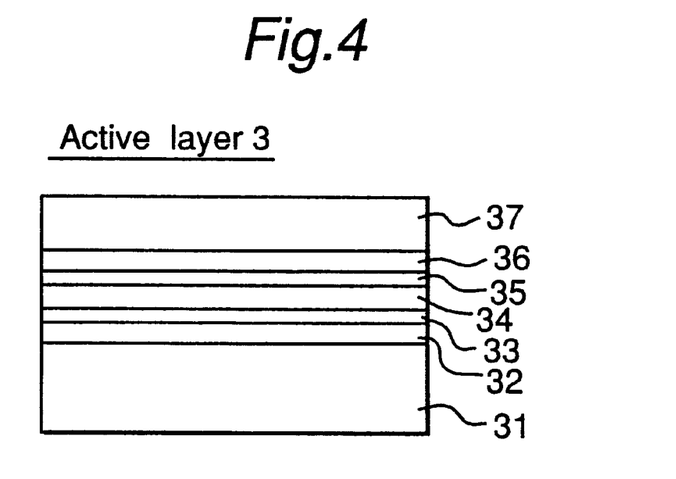
FIG. 4 is a view schematically showing a construction of the active layer 3 of FIG. 1.

In Embodiment 1, the active layer 3 having a quantum well structure is made by laminating a guide layer 31, a guide layer 32, a well layer 33, a barrier layer 34, a well layer 35, a guide layer 36, and a guide layer 37, for example, as shown in FIG. 4. The material and the thickness of each layer are set, for example, as shown in Table 1. An example of the active layer 3 having a double quantum well structure comprising two well layers is in FIG. 4, but the present invention is not limited thereto. Furthermore, the active layer 3 may be composed of a multiple-quantum well structure having a larger number of layers.

TABLE 1

| Layer | Constituent material | Thickness |
| --- | --- | --- |
| Guide layer 31 | $Al_{0.2}Ga_{0.8}As$ | 40 nm |
| Guide layer 32 | GaAs | 20 nm |
| Well layer 33 | $In_{0.2}Ga_{0.8}As$ | 8 nm |
| Barrier layer 34 | GaAs | 20 nm |
| Well layer 35 | $In_{0.2}Ga_{0.8}As$ | 8 nm |
| Guide layer 36 | GaAs | 20 nm |
| Guide layer 31 | $Al_{0.2}Ga_{0.8}As$ | 40 nm |

Furthermore, the thickness of each layer other than the active layer 3 in Embodiment 1 is set as follows.

(1) n-type semiconductor substrate 1: 100 μm (2) n-type lower cladding layer 2: 2 μm (3) total thickness of p-type first upper cladding layer 4 and p-type second upper cladding layer 8: 0.1 to 0.5 μm (4) thickness of ridge waveguide: 1 to 3 μm (5) p-type contact layer 9: 0.1 to 1 μm The thickness of each layer in Embodiment 1 is as described above, but is not limited to this thickness of the layer.

A method for producing the ridge type laser diode according to Embodiment 1 of the present invention will be explained with reference to FIGS. 2A–2G.

Figure 2A:
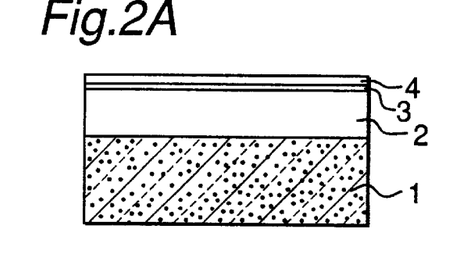
FIGS. 2A–2G are views schematically showing a cross section of a wafer at each step in a method for producing the ridge type laser diode of FIG. 1.

Regarding the method for production, as shown in FIG. 2A, the n-type lower cladding layer 2, the active layer 3 having a quantum well structure and the p-type first upper cladding layer 4 are formed on the n-type semiconductor substrate 1 by epitaxial growth. Incidentally, the thickness of the p-type first upper cladding layer 4 is preferably set within the range from 0.05 to 0.5 μm to stabilize the horizontal transverse mode.

Figure 2B:
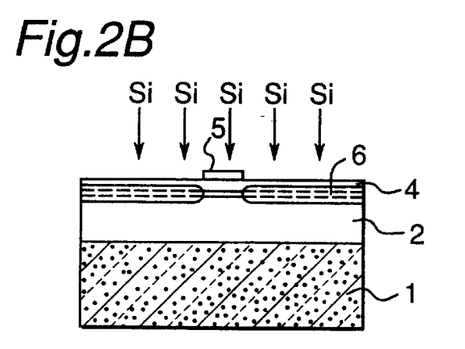

After a photoresist is applied on the whole surface of the upper surface (on the wafer) of the p-type first upper cladding layer 4, the photoresist is patterned to form a stripe-like photoresist 5 extending in a longitudinal direction of the laser resonator. The width W2 of the photoresist 5 is set so that the width W2 is smaller than the width W1 of the ridge waveguide 11 formed in a following step. That is, the width is set so as to satisfy the relation that Width W2 of the photoresist<Width W1 of the ridge waveguide. Si ions are implanted in the vicinity of the active layer 3, as shown in FIG. 2B, using this photoresist 5 as a mask. As a consequence, as shown in FIG. 2B, an Si ion implantation region 6 is formed in the active layer 3 and in a region in the vicinity of the active layer 3 except for a portion immediately below the photoresist 5. An Si dosage amount at the time of Si ion implantation is set to about $1 \times 10^{13}$ to $1 \times 10^{15}$ cm$^{-2}$.

Figure 2C:
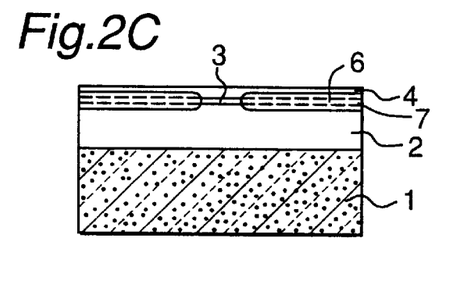

After the photoresist 5 is removed, heat treatment (annealing) is carried out to disorder the active layer 3 doped with Si ions at a predetermined temperature within the range from 700° C. to 900° C. in an atmosphere in which the wafer is subjected to an As pressure. This is because the active layer 3 having a quantum well structure is not disordered only by ion implantation. That is, the active layer 3 in the Si ion implantation region 6 is disordered by diffusing Si atoms in the crystal by heat treatment (annealing) with the result that a disordered region 7 is formed as shown in FIG. 2C. The effective band-gap energy in the disordered region 7 of this disordered active region 3 is larger than the non-disordered active layer 3, and the effective refractive index of the disordered region 7 is smaller than that of the non-disordered active layer 3. As a consequence, the non-disordered active region 3 having a relatively large refractive index among the active layer 3 serves as a substantial active layer 3 which contributes to the laser oscillation.

Figure 2D:
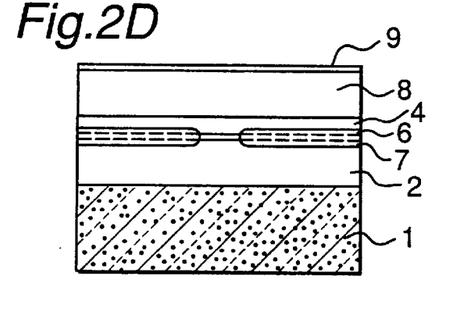
Figure 2E:
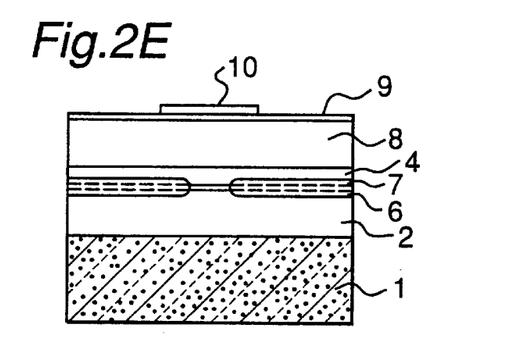
Figure 2F:
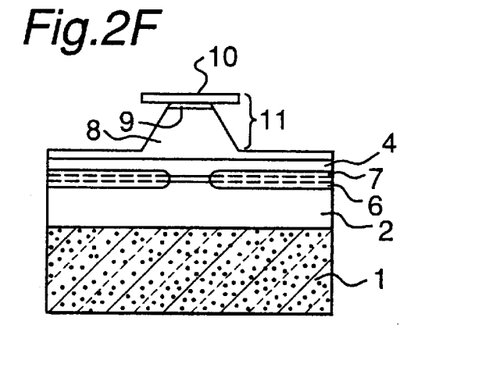
Figure 2G:
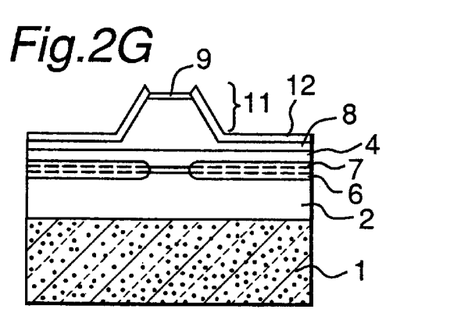

Then, as shown in FIG. 2D, the p-type second upper cladding layer of $Al_{0.5}Ga_{0.5}As$ and the p-type contact layer of p-type GaAs are epitaxially grown on the p-type first upper cladding layer 4 (on the wafer). After an insulating film is formed on the whole surface of the contact layer 9 (whole surface of the wafer), the insulating film is patterned into a stripe-like configuration to form the stripe-like insulating film 10 as shown in FIG. 2E. As a material of this insulating film 10, $Si_3N_4$, $SiO_2$, etc. can be used. By using this stripe-like insulating film 10 as an etching mask, the p-type contact layer 9 of p-type GaAs and the p-type second upper cladding layer 8 of p-type $Al_{0.5}Ga_{0.5}As$ are etched to form the ridge waveguide 11 as shown in FIG. 2F. Examples of an etchant (etching liquid) used at this time include mixture of tartaric acid and hydrogen peroxide or mixture of sulfuric acid, hydrogen hydroxide and water.

After the ridge waveguide 11 is formed and the stripe-like insulating film 10 is removed by wet or dry etching, the insulating film 12 is formed again on the whole surface of wafer. By using the photolithography technique, the stripe-like insulating film 12 on the planar part at the upper part of the ridge waveguide 11 is removed by means of dry etching and an opening 13 is provided in the insulating film 12. Furthermore, a p side electrode 14 is formed from above the insulating film 12. Consequently, the p side electrode 14 comes into contact with the p-type contact layer 9 only at the opening on the upper part of the ridge waveguide 11 so that a current flows in a part located immediately below the p side electrode 14 in each semiconductor layer, such as the active layer, etc. Lastly, after the n side electrode 15 is formed on the lower surface of the n-type semiconductor substrate 1, the laser is separated from the wafer by means of cleavage. Therefore, reflecting surfaces 21 and 22 are formed and the ridge type laser diode according to Embodiment 1 of the present invention is completed. In producing the laser diode according to Embodiment 1, an annealing step is separately provided. However, the present invention is not limited thereto. Disordering may be carried out by heating while applying an arsenic pressure within the crystal growth device before the second crystal growth (before the formation of the p-type second upper cladding layer). When this method is adopted, an annealing step is not required separately with the result that there arises an advantage that the number of steps is reduced.

Figure 3:
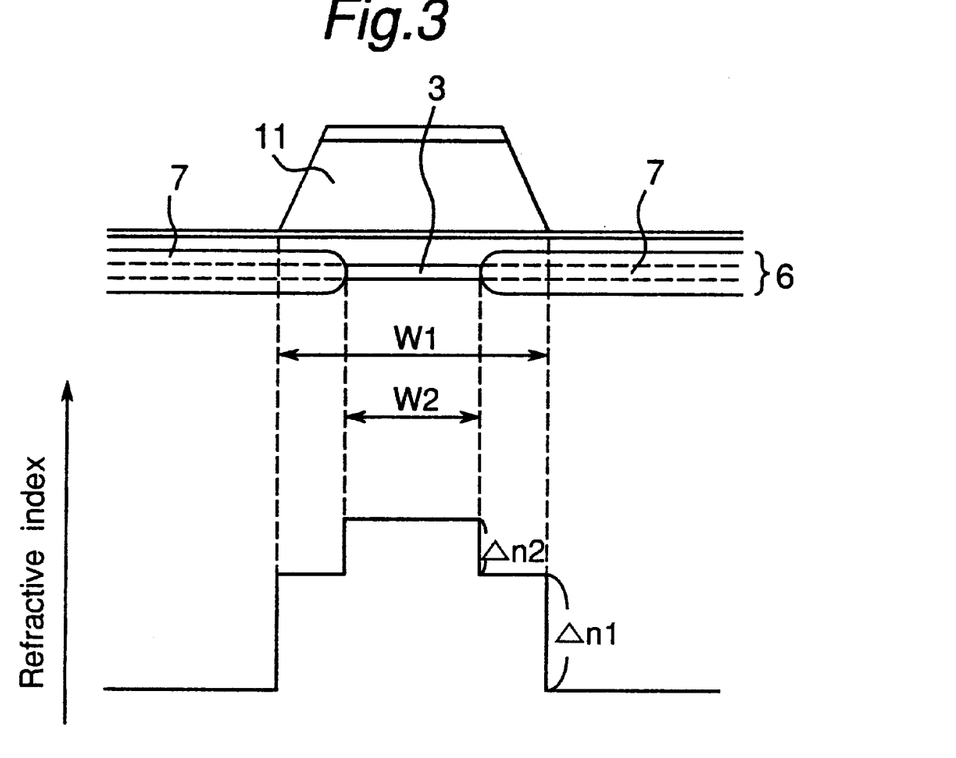
FIG. 3 is a view showing a refractive index distribution in a horizontal direction of an active layer 3 of the ridge type laser diode of FIG. 1.
Figure 11:
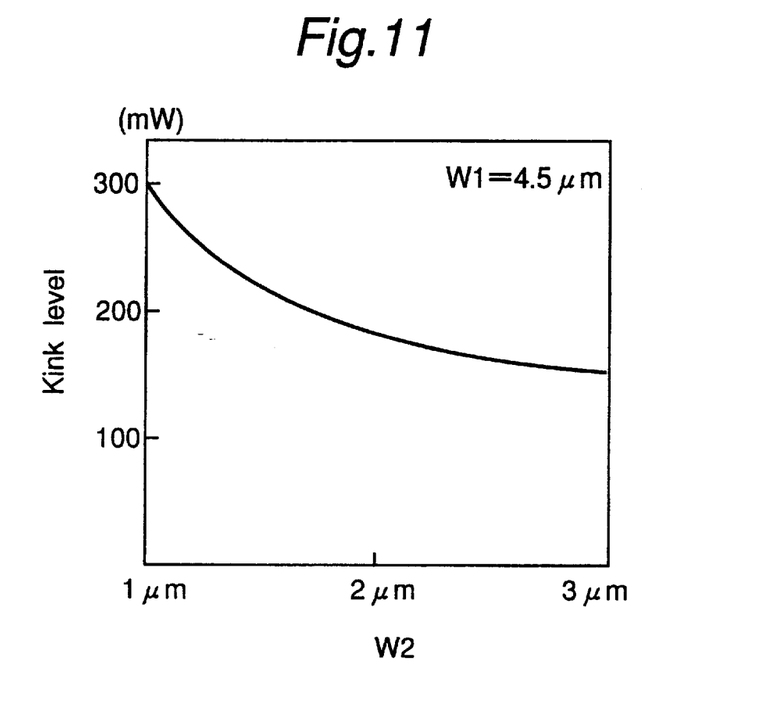
FIG. 11 is a view showing a kink level with respect to a width W2 of the disordered region in the ridge type laser diode according to Embodiment 1 of the present invention.
Figure 12:
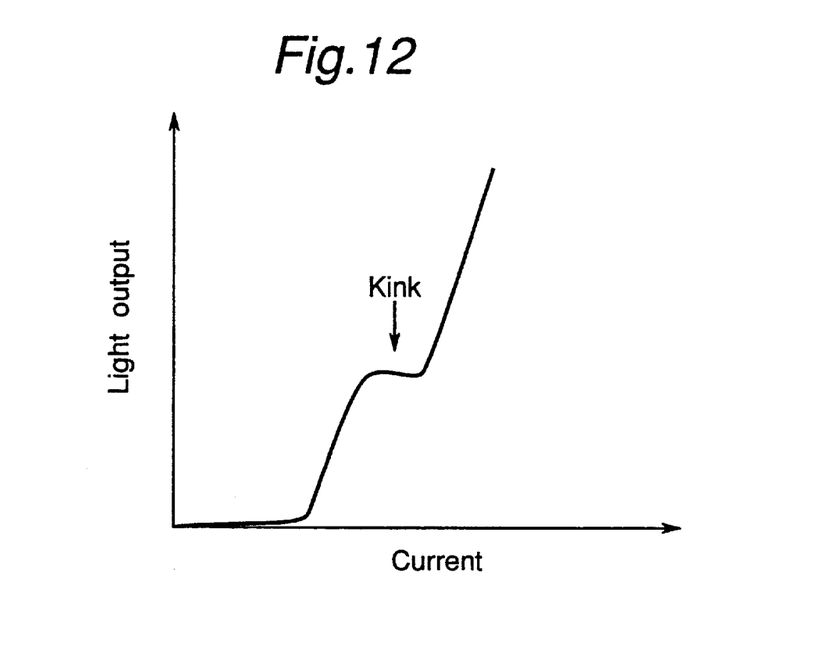
FIG. 12 is a view schematically showing a kink in the characteristics of the ridge type laser diode.

The ridge type laser diode according to Embodiment 1 operates as follows. The refractive index distribution in the active layer 3 of the ridge type semiconductor diode according to Embodiment 1 is shown in FIG. 3. In the ridge type laser diode, a difference in refractive index is present between the disordered region 7 and non-disordered active layer 3, in addition to the refractive index distribution provided by the ridge waveguide 11 in a conventional ridge type laser diode so that the refractive index distribution shown in FIG. 3 is generated. That is, as shown in FIG. 3, an effective refractive index distribution shows a distribution having a two stage structure. As a consequence, since a difference in refractive index is preliminarily provided which can offset influence of a reduction in refractive index in the central part of the active layer 3 during flow of a high density current, which has been described in the explanation of the prior art, the horizontal transverse mode is stabilized so that a variation in peak output is not generated and a kink which causes a practical problem in the light output and current characteristics is not generated. Consequently, when this structure is applied, the problem of the conventional structure can be solved so that the ridge width is not required to be reduced to not more than 3 μm as in the prior art. Therefore, it is possible to provide a ridge type laser diode which causes no problem in practical use of a ridge width of 3 to 6 μm. FIG. 11 shows a kink level with respect to the width W2 of the non-disordered region according to Embodiment 1. As is apparent from FIG. 11, the kink level can be set to not less than 150 mW which causes practically no problem. The kink power refers to an output level at which the kink is generated.

In the ridge type laser diode according to the aforementioned Embodiment 1, differences in refractive index Δn1 and Δn2 shown in FIG. 3 are preferably set within the range from $1 \times 10^{-3}$ to $4 \times 10^{-3}$, and the Δn2 is preferably set to a difference in refractive index of not less than $1 \times 10^{-3}$ which is sufficient to offset the reduction in refractive index at the time of current flow. By setting the refractive index in this manner, a stable horizontal transverse mode can be obtained.

In the ridge type laser diode according to Embodiment 1, the width W2 of the non-disordered region of the active layer immediately below the ridge type waveguide 11 is preferably set to not more than 3 μm to stabilize the horizontal transverse mode. The width of the ridge waveguide 11 is preferably set to a value within the range from 3.5 to 6 μm in view of the steps for production.

Embodiment 2

Embodiment 2 is different from Embodiment 1 in that an etching stop layer 16 is provided between the p-type first cladding layer 4 and the p-type second upper cladding layer 8. In other respects, Embodiment 2 is the same as Embodiment 1.

Figure 5:
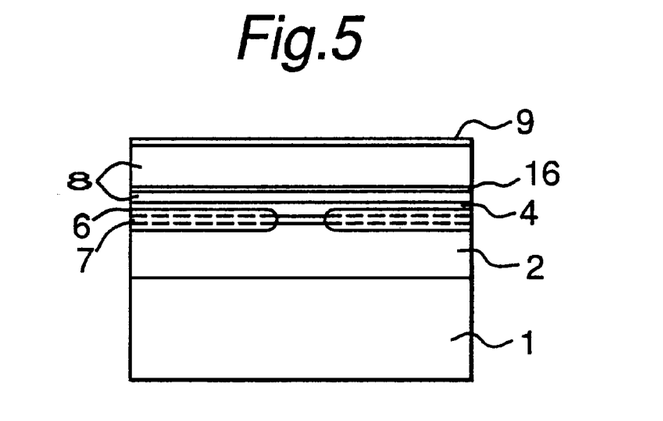
FIG. 5 is a view schematically showing a cross section of a wafer at one step in the method for producing the ridge type laser diode according to Embodiment 2 of the present invention.

That is in Embodiment 2, the ridge type laser diode according to Embodiment 1, as shown in FIG. 5 has an etching stop layer 16 inserted into the p-type second upper cladding layer 8, the etching stop layer 16 having an etching rate smaller than that of the p-type second upper cladding layer 8 so that the etching is stopped at the etching stop layer 16 at the time of the ridge etching. Consequently, the configuration of the ridge wave guide 11 and the thickness of the cladding layer, other than the ridge waveguide 11 (total thickness of the p-type first cladding layer 4 and the p-type second upper cladding layer 8 after etching), can be maintained. Therefore, a difference in refractive index Δn1 generated by the ridge waveguide 11 can be constantly maintained at a predetermined value so that various advantages such as improvement in stability of the device characteristics of the ridge type laser diode, improvement in reproducibility at the time of production, improvement in yield, etc. can be obtained.

Incidentally, in the p-type second upper cladding layer 8 of p-type $Al_{0.5}Ga_{0.5}As$, there can be used a p-type AlGa As layer whose Al composition ratio is set to a level larger than that of the p-type $Al_{0.5}Ga_{0.5}As$ constituting the p-type second upper cladding layer 8. In this case, in the p-type AlxGayAs layer (X+Y=1) used as the etching stop layer 16, the Al composition ratio is preferably set so as to satisfy the expression X>0.6 or more. A mixture of tartaric acid and hydrogen peroxide is preferably used. As a consequence, the function as an etching stop layer can be sufficiently attained, and it is effective. Furthermore, the method for production can be easily realized by forming a part of the p-type first upper cladding layer 8 on the p-type first upper cladding layer 4, forming the etching stop layer 16 and forming the p-type second upper cladding layer 8 in the same step as those in the ridge waveguide 11 is formed.

Embodiment 3

Figure 6:
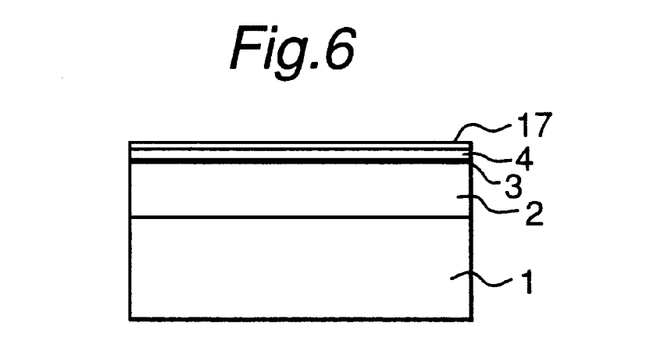
FIG. 6 is a view schematically showing a cross section of a wafer at one step in the method for producing the ridge type laser diode according to Embodiment 3 of the present invention.

Embodiment 3 is different from Embodiment 1 in that an insulating film 17 is formed on the p-type first upper cladding layer 4 and the p-type second upper cladding layer 8 is formed on the insulating film 17. In other respects, Embodiment 3 is the same as Embodiment 1. That is, in the method for production of Embodiment 1, after an epitaxial growth of the p-type first upper cladding layer 4, the insulating film 17 is formed for surface protection as shown in FIG. 6. As a consequence, according to the method for production of Embodiment 1, when a photoresist is directly applied to the wafer (p-type first upper cladding layer 4) at the transfer step after the epitaxial crystal growth of the p-type first upper cladding layer 4, there is a possibility that the surface of the p-type first upper cladding layer 4 will be contaminated with an organic substance, and lattice defects caused by the contamination at the time of the regrowth step of the p-type second upper cladding layer 8 is generated. Therefore, it is possible to prevent the generation of the lattice defect by depositing the insulating film 17 for surface protection in advance as seen in Embodiment 3.

In Embodiment 3, when using SiO generally used as an insulating film, SiO absorbs Ga in the GaAs crystal at the annealing step so that lattice defects such as Ga vacancies are generated in the crystal. Accordingly, $Si_3N_4$ free from such action is preferably used as the insulating film 17.

In Embodiment 3, the thickness of the insulating film 17 of $Si_3N_4$ is preferably set to not less than 20 nm and not more than 50 nm for the following reason.

That is, with the increase in acceleration voltage at the time of ion implantation, the damage degree of the crystal increases, and the reliability thereof is deteriorated at the time of using as a laser diode. Accordingly, when the thickness of the insulating film 17 for protection is larger than 50 nm, a larger acceleration voltage is required, which is a disadvantage in view of reliability. On the other hand, in order to form the insulating film 17 with good reproducibility, a thickness of not less than 20 nm is required. Accordingly, it becomes possible to obtain a semiconductor laser having excellent device characteristics with good reproducibility by setting the film thickness of the insulating film 17 of $Si_3N_4$ to not less than 20 nm and not more than 50 nm.

Embodiment 4

The ridge type laser diode according to Embodiment 4 is different from Embodiment 1 in that the p-type second upper cladding layer 8 is formed after forming the surface protective layer 18 of GaAs on the p-type first upper cladding layer 4. In other respects, Embodiment 4 is the same as Embodiment 1.

Figure 7:
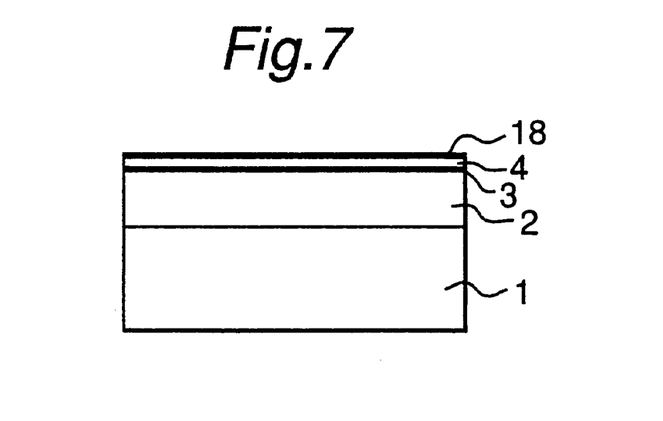
FIG. 7 is a view schematically showing a cross section of the wafer at one step in the method for producing the ridge type laser diode according to Embodiment 4 of the present invention.

In Embodiment 4, in the method for production of Embodiment 1, the surface protective layer 18 of GaAs is formed on the p-type first upper cladding layer 4 of p-type $Al_{0.5}Ga_{0.5}As$ at the time of the first growth, as shown in FIG. 7. The p-type $Al_{0.5}Ga_{0.5}As$ of the p-type first upper cladding layer has a property in which Al is liable to be combined with oxygen, and $Al_2O_3$ can be easily formed. Furthermore, when a crystal is to be grown on the surface, there is a high possibility that lattice defects are generated on the interface. Consequently, it becomes possible to carry out a good quality recrystal growth when the surface protection layer 18 of GaAs includes no Al and so is hardly oxidized, as in Embodiment 4, resulting in the effect that it becomes advantageous in view of reliability of the device.

In Embodiment 4, when the thickness of the surface protective layer 18 is not less than 15 nm, a larger acceleration voltage is required at the time of the following step of ion implantation of the active layer 3. At the time of ion implantation, since the frequency of the lattice defect generation abruptly increases, the thickness of the surface protective layer 18 is preferably not more than 15 nm. Furthermore, when the wavelength of the excitation of the ridge type semiconductor diode according to Embodiment 4 is within the range from 0.78 to 0.85 μm, the laser beams generated in the active layer 3 is reabsorbed by the surface protective layer 18 and the device characteristics are deteriorated. Therefore, by setting the thickness to not more than 15 nm, the band-gap energy in the surface protective layer 18 is effectively enlarged by the quantum effect and it becomes difficult to absorb the light generated in the active layer 18, thereby making it possible to prevent the deterioration of the device characteristics.

Figure 8:
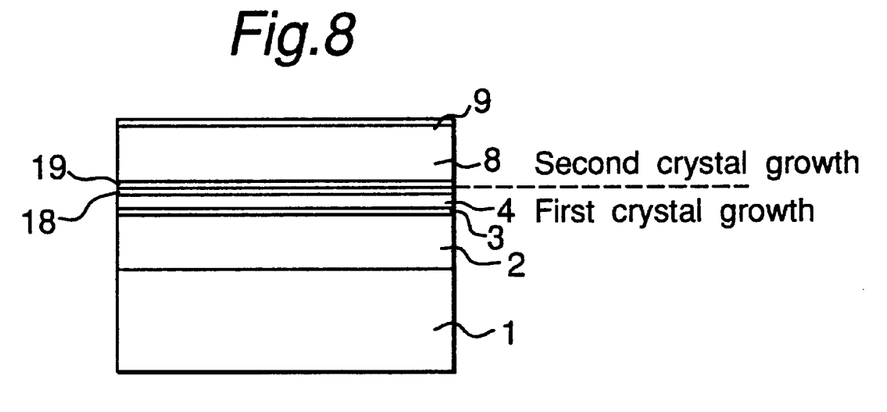
FIG. 8 is a view schematically showing a cross section of a wafer at one step in the method for producing the ridge type laser diode according to a modification of Embodiment 4 of the present invention.

In the aforementioned Embodiment 4, as shown in FIG. 8, a second surface protective layer 19 of GaAs having the same function as the surface protection layer 18 may be further provided on the surface protective layer 18. Consequently, an influence of the lattice defects generated at the interface can be further reduced, and the deterioration of the reliability can be prevented. In this case, for the same reason as the case where the aforementioned protective layer is constituted with a single layer, the total thickness of the surface protective layer 18 and the second surface protective layer 19 is preferably set to not more than 15 nm.

Embodiment 5

Figure 9:
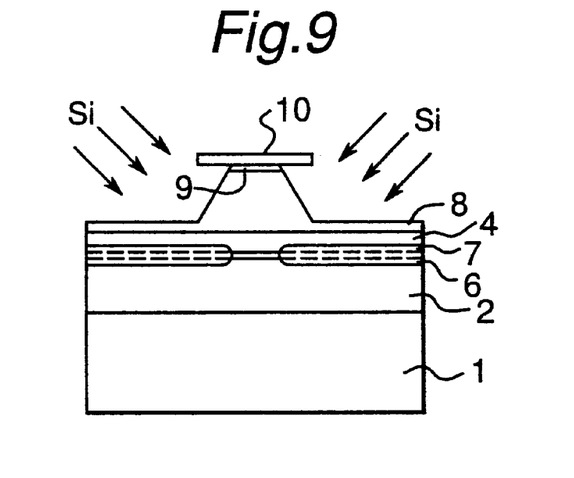
FIG. 9 is a view schematically showing a step of ion implantation in the method for producing the ridge type laser diode according to Embodiment 5 of the present invention.

The ridge type laser diode according to Embodiment 5 has the same construction as Embodiment 1, but is different from Embodiment 1 in the method for production. In the method for producing the ridge type laser diode according to Embodiment 5, all layers are grown in one step at the time of the epitaxial growth. A disordered region 7 is formed by implanting from a diagonal direction as shown in FIG. 9 after forming the ridge waveguide 11 according to the same manner as Embodiment 1. Since the crystal layers are grown in one step according to this method, there is an advantage that the production process is shortened.

Embodiment 6

Figure 10:
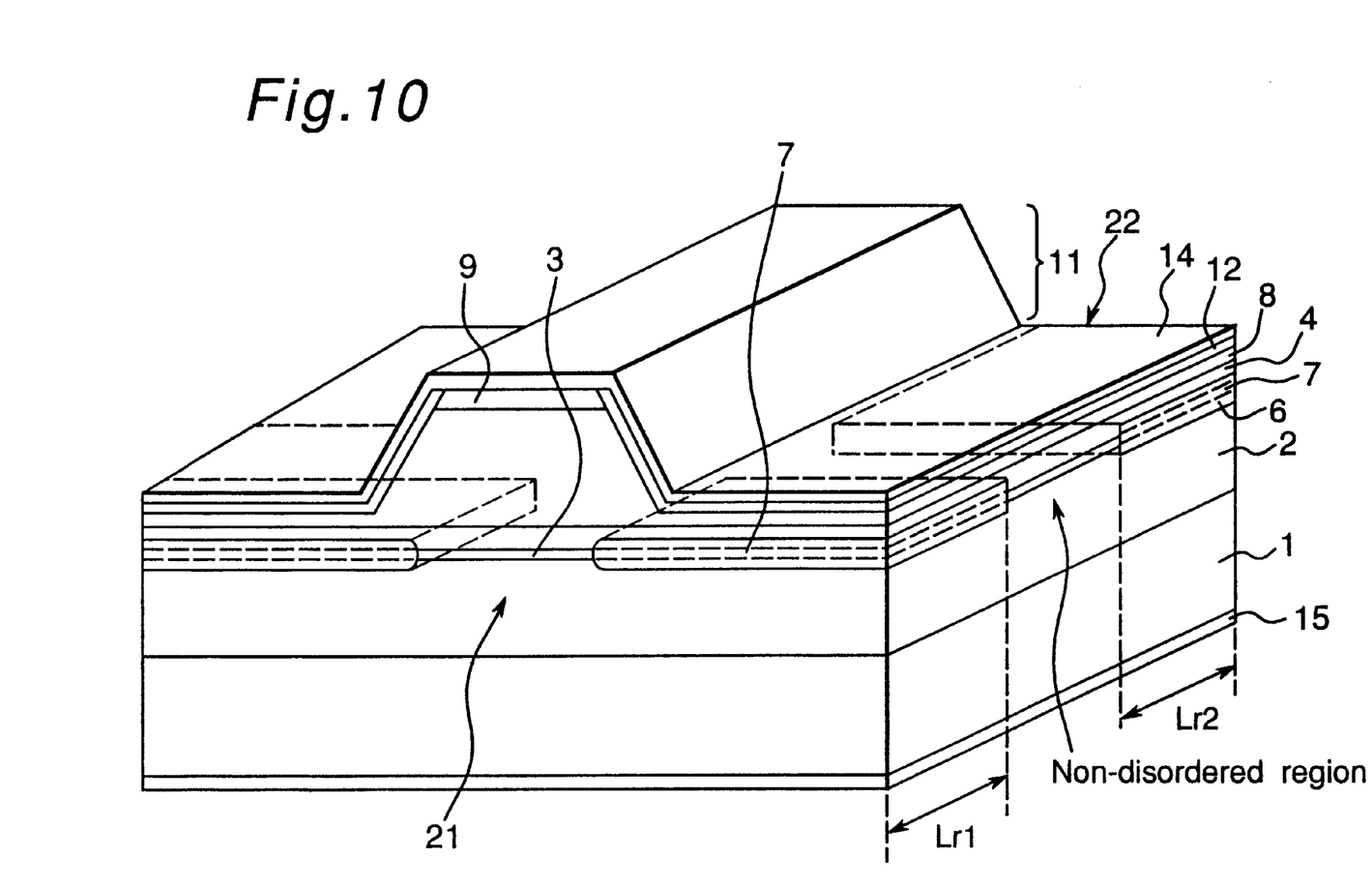
FIG. 10 is a perspective view schematically showing a construction of the ridge type laser diode according to Embodiment 6 of the present invention.

The ridge type laser diode according to Embodiment 6 is different from the ridge type semiconductor diode according to Embodiment 1 in that the disordered region 7 is not provided on the whole waveguide, but the disordered region 7 is provided only in a part of a predetermined waveguide length Lr1 and Lr2 from the reflecting surfaces 21, 22, as shown in FIG. 10, so that the disordered region is provided only in the interior portion of the axial direction of the ridge type laser diode. In the disordered region 7, there is a possibility that the lattice defect which cannot be restored even by annealing is present and, therefore, an attempt can be made to improve reliability by reducing the ratio of the disordered region 7 with respect to the whole device as shown in Embodiment 6. Incidentally, from the viewpoint of the stabilization of the horizontal transverse mode, the device can be stabilized by constituting only the waveguide shown in FIG. 1, the two stage refractive index structure in the vicinity of the end surface shown in FIG. 1. Therefore, the same advantage as that of Embodiment 1 can be obtained.

Incidentally, in Embodiment 6, the length Lr1 and Lr2 of the disordered waveguide is preferably set to not less than 5 μm and not more than 40 μm.

What is claimed is:

1. A laser diode comprising:

a semiconductor substrate; and successively arranged on the semiconductor substrate, a lower cladding layer, an active layer having a quantum well structure, and an upper cladding layer, the upper cladding layer including a ridge waveguide having a width, the active layer being wider than the ridge waveguide and including, located directly opposite the ridge waveguide, a first high refractive index region having a first refractive index, and second high refractive index regions located adjacent and on opposite sides of the first high refractive index region and having a second refractive index lower than the first refractive index, the second high refractive index regions comprising disordered regions of the active layer, and located adjacent and on opposites sides of the second high refractive index regions, disordered portions of the active layer having a third refractive index lower than the second refractive index.

2. The laser diode according to claim 1, wherein the width of the ridge waveguide is within a range from 3.5 μm to 6 μm, and the first high refractive index region has a width not more than 3 μm.

3. The laser diode according to claim 1, including, within the upper cladding layer, an etching stop layer of a material having an etching rate smaller than that of the upper cladding layer with respect to an etching solution used for forming the ridge waveguide.

4. The laser diode according to claim 1, including a protective film disposed on the upper cladding layer.

5. The laser diode according to claim 4, wherein the protective film is $Si_3N_4$.

6. The laser diode according to claim 5, wherein the thickness of the protective film is not less than 20 nm and not more than 50 nm.

7. The laser diode according to claim 1, wherein the upper cladding layer includes a first upper AlGaAs cladding layer, a second upper AlGaAs cladding layer including the ridge waveguide, and a protective film of GaAs located between the first upper AlGaAs cladding layer and the second upper AlGaAs cladding layer.

8. The laser diode according to claim 7, wherein the protective film comprises a first protective film and a second protective film on the first protective film.

9. The laser diode according to claim 1, wherein each of the disordered regions of the active layer includes two separated parts respectively extending from respective reflecting surfaces of the laser diode, each of the parts of a disordered region being separated by a non-disordered region of the active layer.

10. The laser diode according to claim 1, including reflecting surfaces transverse to the active layer and wherein laser light is emitted from the laser diode parallel to the active layer.

11. A laser diode comprising:

a semiconductor substrate; and successively arranged on the semiconductor substrate, a lower cladding layer, an active layer having a quantum well structure, and an upper cladding layer, the upper cladding layer including a ridge waveguide having a width, the active layer being wider than the ridge waveguide and including, located directly opposite the ridge waveguide, a first high refractive index region having a first refractive index, and second high refractive index regions located adjacent and on opposite sides of the first high refractive index region and having a second refractive index lower than the first refractive index, the second high refractive index regions comprising disordered regions of the active layer, wherein each of the disordered regions of the active layer includes two separated parts respectively extending from respective reflecting surfaces of the laser diode, each of the parts of a disordered region being separated by a non-disordered region of the active layer.

12. The laser diode according to claim 11, wherein the active layer outside the first and second high refractive index regions is disordered and has a third refractive index lower than the second refractive index.

13. The laser diode according to claim 11, wherein the width of the ridge waveguide is within a range from 3.5 μm to 6 μm, and the first high refractive index region has a width not more than 3 μm.

14. The laser diode according to claim 11, including reflecting surfaces transverse to the active layer and wherein laser light is emitted from the laser diode parallel to the active layer.

* * * * *